United States Patent
Kempf

[19]

[11] Patent Number: 5,879,121
[45] Date of Patent: Mar. 9, 1999

[54] SUBSTRATE TRANSPORTING APPARATUS

[75] Inventor: Stefan Kempf, Alzenau-Albstedt, Germany

[73] Assignee: Singulus Technologies GmbH, Alzenau, Germany

[21] Appl. No.: 802,792

[22] Filed: Feb. 18, 1997

[30] Foreign Application Priority Data

Feb. 15, 1996 [DE] Germany ......................... 196 05 599.7

[51] Int. Cl.[6] .................................................. B65G 65/02
[52] U.S. Cl. .............................. 414/226; 294/95; 294/87; 414/908
[58] Field of Search ..................... 414/217, 222, 414/225, 226, 908; 294/88, 95, 97; 118/500, 502, 503, 728; 369/270, 271; 360/99.05; 279/2.06–2.09

[56] References Cited

U.S. PATENT DOCUMENTS

| | | | |
|---|---|---|---|
| 3,253,853 | 5/1966 | Loyer et al. | 294/88 |
| 4,199,183 | 4/1980 | Heiker | 294/97 |
| 4,676,710 | 6/1987 | Shiraishi | 414/225 |
| 4,948,187 | 8/1990 | Blaseck | 294/95 |
| 5,451,130 | 9/1995 | Kempf | 414/217 X |
| 5,637,200 | 6/1997 | Tsymberov | 118/728 X |
| 5,669,652 | 9/1997 | Reising et al. | 294/97 X |
| 5,675,957 | 10/1997 | Kim | 414/225 X |
| 5,698,030 | 12/1997 | Rubenchik | 118/500 X |

FOREIGN PATENT DOCUMENTS

G 93 07 263.5  7/1993  Germany .

*Primary Examiner*—David A. Bocci
*Attorney, Agent, or Firm*—Pillsbury Madison & Sutro

[57] ABSTRACT

An apparatus for transporting substrates between a first device and at least one second device for gripping and holding substrates with a substrate holder disposed in a vacuum chamber. The first device for gripping and holding substrates is equipped with one or more movable grippers which are movable by a mechanical and/or electromechanical or magnetically operating displacement device into a position that holds or releases the substrate, and the second device for gripping and holding substrates is equipped with one or more movable grippers which are movable counter to the action of a control pressure or of a spring, into a first position and, via the action of a diaphragm that can be subjected to a pneumatic pressure and/or a vacuum pressure and an adjusting part cooperating with the diaphragm, into a second position, wherein in the one position the substrate is held and in the second position the substrate is released for further transport, and in the position of the two devices for transfer of the substrate two substrate receiving parts can be aligned and fixed coaxially with one another.

32 Claims, 5 Drawing Sheets

SUBSTRATE TRANSPORTING APPARATUS

BACKGROUND OF THE INVENTION

The invention relates to an apparatus for transporting substrates between a first device and at least one second device for gripping and holding substrates with one or more substrate holders disposed in a vacuum chamber.

A device for gripping and holding a disklike substrate is disclosed in German Utility Model DE-GM 93 07 263.5. This device comprises a number of circularly arranged grippers and an elastic diaphragm which is disposed in a pressure-proof housing that has an opening. Different pressures can be established on the front and back sides of the diaphragm, and the diaphragm may be arranged such that at a differential pressure, a deflection of the diaphragm out of its position of repose takes place, while at a pressure equilibrium the diaphragm returns to its position of repose via a compression spring.

The differential pressure at the diaphragm is generated in that a bell-shaped housing, which is provided with a central bore, is disposed on one side of the diaphragm. A pressure chamber is formed between the end of the bore of the bell-shaped housing and the surface of the diaphragm. The bore provided in the bell-shaped housing is provided via a pneumatic line with an external pump whose sole function is to establish a differential pressure on the surface of the diaphragm, relative to the vacuum pressure provided in the chamber beneath, so that by imposition of pressure on the diaphragm and by means of an adjusting part adjoining the diaphragm, the gripper arm can be adjusted out of its position that holds the substrate into a further position in which the gripper or grippers release the substrate. Such an apparatus is complicated and expensive, since a separate pump is required to generate this differential pressure, and the diaphragm must be sealed off from the pressure in the vacuum chamber so that the requisite pressure can be generated on the back side of the diaphragm. Moreover, such an arrangement is highly vulnerable to malfunction, since the additionally required pump operates entirely uncoupled from the other pumps to generate the vacuum pressure in the vacuum chamber, so that a completely exact adaptation to the operating process for adjusting the diaphragm and removing the substrate is impossible. Overall, such an apparatus works relatively slowly, since the release of the substrate cannot occur until the necessary system pressure downstream of the diaphragm has built up via the independent pump. The compressed-air supply line must be disposed flexibly relative to the holding mechanism.

SUMMARY OF THE INVENTION

An object of the invention is to provide a mechanical or electromechanical first device for receiving substrates and a vacuum-pressure-controllable second device for receiving substrates which are arranged and aligned in such a way that fast transfer of the substrate can be done without delay and without harming the surface of the substrate.

These objects are attained by the invention in that the first device for gripping and holding substrates is equipped with one or more adjustably arranged grippers, which are adjustable by means of a mechanical and/or electromechanical or magnetically operating adjusting device into a position that holds or releases the substrate, and the second device, oriented coaxially to the first, for gripping and holding substrates is likewise equipped with one or more adjustably arranged grippers.

Because of the advantageous joining together of the electromechanical first device for gripping the substrates with the vacuum-pressure-controllable second device for gripping the substrates, a malfunction-free process sequence between the two gripper devices is assured, and at the same time it is also assured that no damage to the surface of the substrates will occur, since the grippers engage the intended openings in the substrates and in this way hold the substrates in the desired position. By means of the electromechanical adjusting device and the associated grippers, which by means of the adjusting device execute a tilting motion, the substrate can readily be grasped in the opening, or bore, intended for this purpose and secured, to which end the corresponding grippers are adjusted into a vertical position. By means of the magnets, an optimal adjusting force is obtained, which within milliseconds brings about the desired pivoting motion at the grippers. After the transfer from one gripper device to another, the second gripper is triggered via the vacuum control to receive the substrate; in an optimal way, the vacuum pressure of the second vacuum chamber is used, so that any additional devices can be thus dispensed with. This second gripper device likewise functions very exactly, and by the engagement of these grippers with the bore provided in the substrate, it is again assured that the surface of the substrates will not be contacted in any way.

To this end it is advantageous that the grippers are adjustable, counter to the action of a control pressure or counter to the action of a spring, into a first position and, via the action of a diaphragm that can be subjected to a pneumatic pressure $P_a$ and/or vacuum pressure $P_v$, and an adjusting part cooperating with the diagram, into a second position, wherein in the one position the substrate is held and in the second position the substrate is released for further transport, and in the position of the two devices for transfer of the substrate, the two substrate receiving parts can be aligned and fixed coaxially with one another, and after coaxial alignment and with vacuum-tight contact of the two devices, the pressure in the infeed chamber is lowered, and the substrate dispensed to the second device via the first device is held by means of the second device via the spring pressure now being released, and a spring-elastic connecting element that allows a reciprocation is provided between a turntable of the second device and a substrate holder. An additional possibility, in accordance with a further feature of the apparatus of the invention, is that the connecting element comprises a middle flange that is joined to the substrate holder via connecting elements and to the turntable via elastic webs; that the grippers associated with the first device can be pivoted by means of a control element or magnet and/or spring elements about an axis between a position that holds the substrate and a position that releases the substrate; and that the grippers associated with the first device are pivotable about an axis that intersects the longitudinal axis of the gripper or of the housing at an approximately right angle.

It is also advantageous that the grippers associated with the first device already respond when the infeed chamber is flooded, and the grippers of the second device are adjusted via the electromagnet into a receiving position; and that two or more spaced-apart grippers of the first device, upon substrate transfer, engage the interstices between the also spaced-apart grippers of the second device. Because of the exactly controllable process sequence and the accurate adaptation of the two cooperating gripper devices, an exact transfer of the substrate from one device to the other can be done, and this can be accomplished with a minimum of components.

According to a further feature of the invention, it is advantageous that the grippers are guided in the region of one end in oblong-slot openings, and in the region of their other end, in a cylinder housing, and have at least one permanent magnet which cooperates with a ring magnet. By using the elongated, relatively narrow grippers for receiving the substrates, corresponding interstices can be created between the individual substrate holders, so that two cooperating devices can be brought quite close together in order to assure an exact transfer of the substrates between the two devices.

One additional possibility in accordance with a further feature of the apparatus of the invention is that the cylinder housing is embodied with thin walls having a wall thickness between 0.2 mm and 1.0 mm, or between 0.3 mm and 0.7 mm, or preferably 0.4 mm and 0.6 mm.

It is also advantageous that the grippers are pivotably received in an elastic ring bearing and are adjustable in the region of their upper end between magnetizable stops.

It is also advantageous that the diaphragm exposed to an approximately constant vacuum pressure $P_v$ on one side is controllable via a differential pressure $P_d=P_a-P_v$ that occurs whenever the chamber for receiving the substrate is flooded.

An additional possibility in accordance with a further feature of the apparatus of the invention is that the diaphragm is controllable via the atmospheric and/or vacuum pressure or the differential pressure $P_d$ that results from the atmospheric pressure $P_a$ in the infeed chamber, minus the vacuum pressure $P_v$ in the vacuum chamber. Because of the advantageous disposition of the diaphragm, which protrudes into the vacuum chamber, it is possible for the first time in a simple way to use the vacuum pressure occurring in the chamber as a manipulated variable for adjusting the diaphragm.

According to a further feature of the invention, it is advantageous that the diaphragm disposed in the vacuum chamber is formed of one flexible part and one nonflexible part or a metal part or plate. By using one flexible and one nonflexible part to form the diaphragm, an exact guidance of the adjusting part for adjusting or pivoting the grippers is created.

In a preferred embodiment of the invention, it is finally provided that the nonflexible part is firmly joined to the flexible part of the diaphragm, and that the nonflexible part is embodied as a circular-round plate, which covers an opening of the diaphragm.

It is also advantageous that the flexible part of the diaphragm is firmly connected by its outer edge to a flange of the device and by its inner edge to the edge of the opening provided in the plate, and that the diaphragm and the plate seal off the chamber, which is exposed to a constant vacuum pressure $P_v$, from the chamber or infeed chamber that can be exposed to an atmospheric pressure $P_a$.

It is moreover advantageous that the outer edge of the diaphragm can be clamped and secured in at least one groove provided between the flange and the outer part of the substrate holder, and that the plate is joined or screwed, via a coaxial protrusion, to a cylindrical part that is guided on a protrusion joined to a likewise coaxially arranged flange. By using a groove to receive the outer edge of the diaphragm, a very simple type of fastening for the diaphragm is obtained, which moreover has a high degree of tightness relative to the flooded chamber and the vacuum chamber. Since the plate is joined or screwed to the cylindrical part via a coaxial protrusion, the diaphragm can be released easily if it should become damaged. Releasing the diaphragm is done simply by unscrewing the plate and releasing the clamping connection of the diaphragm. After that, these parts can easily be replaced.

It is also advantageous that the cylindrical part is firmly joined to the adjusting part, and that the adjusting part rests against one or more grippers in the region of its one end.

One additional option in accordance with a further feature of the apparatus of the invention is that the cylindrical part, with its one or second end or its plate, can be placed against a fixed flange and with its first or other end or adjusting part against the gripper or lever arm of the gripper, and that if differential pressure $P_d$ occurs, the diaphragm moves farther into the vacuum chamber and in the process moves the gripper or grippers away from the bore edge of the substrate and releases the substrate.

According to a further feature of the invention, it is advantageous that the fixed flange is indirectly or directly firmly joined to the flange of the device and has a cylindrical extension in which the spring is received. By using a cylindrical extension on the fixed flange, good guidance of the spring is assured and at the same time it is assured that an immediate adjustment of the grippers takes place when there is a pressure equilibrium between the two chambers.

It is also advantageous that between the flange of the device and the fixed flange, a support part for the pivotable reception of the grippers is provided, and that the fixed flange and the support part are releasably joined to the flange of the device via the same connecting elements. Since the support part for receiving the grippers is disposed between the two flanges, a very good, simple fixation of the mount is obtained.

A substantially advantageous embodiment is attained by providing that the chamber or infeed chamber located above the diaphragm is evacuated via a first vacuum pump and flooded via a further device, and the chamber located below the diaphragm is evacuated via a second vacuum pump, and the two vacuum pumps or the associated valves are controllable in such a way that the differential pressure $P_d$ can be lowered to nearly zero, and that the upper chamber, which is flooded via a device or a control valve, necessarily thereby initiates the immediate displacement of the grippers.

Further advantages and details of the invention will be described below in the description, and shown in the drawings.

DESCRIPTION OF THE PREFERRED EMBODIMENTS

Figure 1:
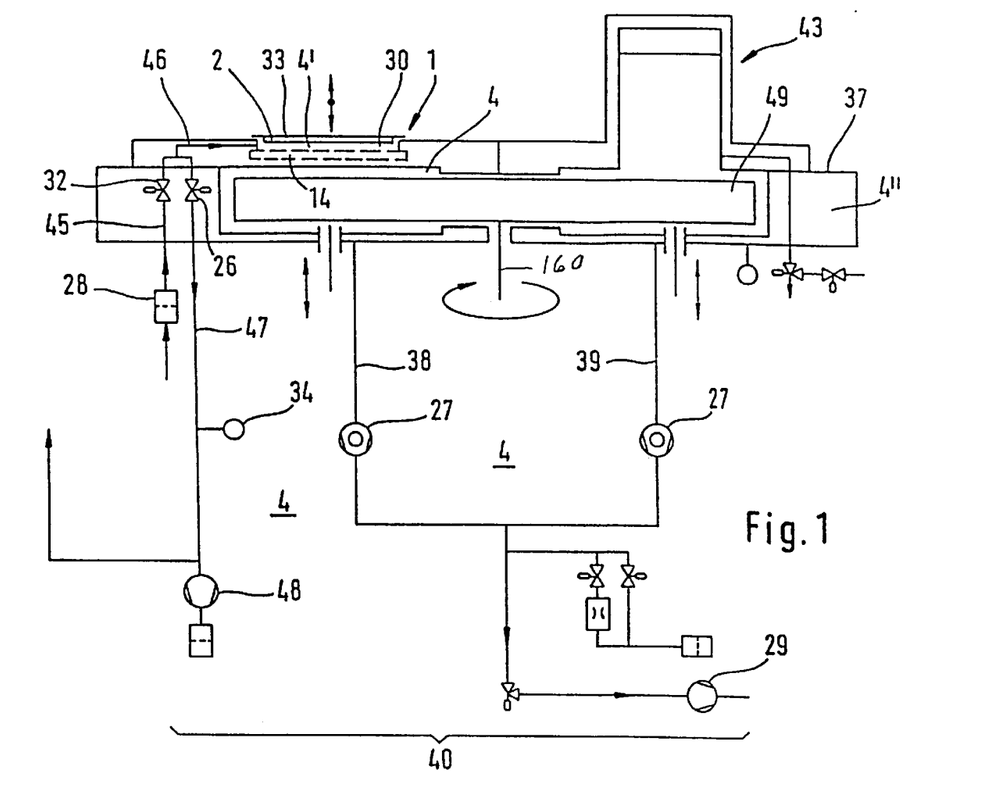
FIG. 1 is a simplified pictorial view of substrate transporting apparatus in a sputtering system.
Figure 2:
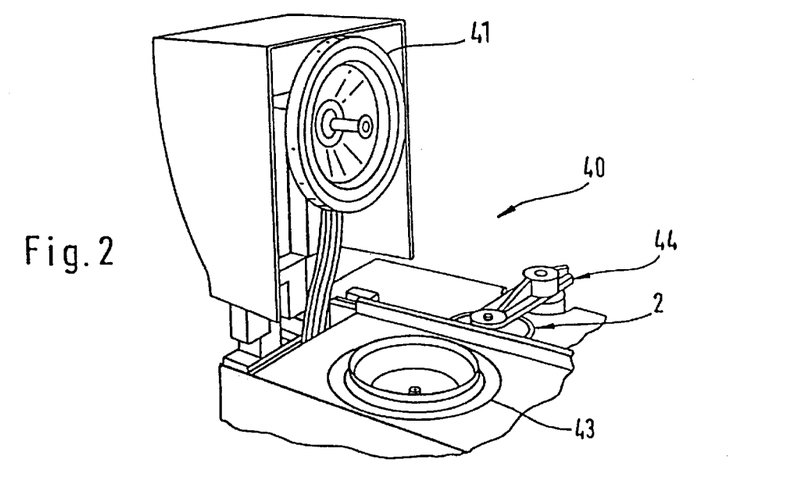
FIG. 2 is a perspective view of an apparatus for coating compact disks.

In the drawing, FIG. 2 shows a perspective view of an upper portion of a sputtering system 40, which includes a gripper arm 44, supported to be rotatable through an angle 180° about a vertical axis, by means of which substrates or compact disks (CD) 2 are delivered to a device, or disk receiver, 1 (FIG. 1) for gripping substrates. Via this device 1, the substrates reach a processing station 43, which also includes a cathode 41 shown in an open position in FIG. 2. The sputtering system shown in FIG. 2 can be constituted, for example, by a system marketed by Singulus Technologies GmbH of Alzenau, Germany, under the model designation SINGULUS III.

In FIG. 1, the functional diagram of the sputtering system 40 is shown along with the essential parts of the apparatus.

The substrate 2 is given up by means of the gripper arm 44 and an associated plate 33, which also includes a gripper device not shown in FIG. 1, to a further device for gripping substrates. In FIG. 1, the plate 33 is located above a plate or substrate receiving part 14. In the position of FIG. 1, the two plates 33 and 14 are oriented coaxially to one another, so that the substrate 2 can be given up by the plate 33 to the substrate receiving part 14.

In the position of FIG. 1, the plate 14 has moved upwardly and seals off an annular volume or infeed chamber 30. The infeed chamber 30 is located between the upper plate 33 and the lower plate, or substrate receiving part, 14. The gripper elements provided on the plate 33, which are not shown in FIG. 1, hold the compact disk above the substrate receiving part 14.

The infeed chamber 30 can be flooded via a filter 28, which for that purpose communicates via a line 45 with a valve 32 that is connected via a further line 46 to the infeed chamber 30. By opening the valve 32, the infeed chamber 30 is flooded. Once the infeed chamber 30 has been flooded, the upper plate is raised, so that the substrate 2 can be replaced. By means of the gripper arm 44, a finished coated compact disk 2 can be delivered to a further transport device, not shown. At the same time, a new compact disk 2 to be processed is placed in the infeed chamber 30. Lowering of plate 33 causes an O ring, not shown in the drawing, to be pressed against the surface of a housing 37 of the infeed chamber 30, which is thereby closed in vacuum-tight fashion. The atmospheric pressure prevailing in the infeed chamber 30 is evacuated by closure of the valve 32, followed by opening of a valve 26 which communicates with the infeed chamber 30 via the line 46. A vacuum pump 48 pumps out the air in the infeed chamber 30 and generates the requisite vacuum pressure.

In this operation, grippers 3 open, which are shown in detail in FIG. 3 and described in detail below. The grippers 3 grasp the substrate or compact disk 2. This occurs immediately when the pressure in the infeed chamber 30 is approximately equivalent to the pressure in a vacuum chamber 4 (FIG. 3), or in other words once a pressure equilibrium has been established. If the infeed chamber 3 has been evacuated enough that the requisite measuring pressure, which is ascertained by means of a measuring cell 34, is established, then the device 1 can be lowered downward, and the substrate 2 placed on the turntable 49 (FIG. 1) can be delivered in increments to the processing station 43 by means of the turntable 49. To that end, the turntable 49 rotates onward by 120° in each step. In FIG. 2, turntable 49 is located below station 43 and compact disk 2. The gripper arm 44 shown in FIG. 2 is not shown in FIG. 1.

Next, the substrate receiving part 14 is raised and an O ring, not shown, presses against the underside of the cathode 41.

After this work step, the infeed chamber 30 can again be flooded via the valve 32. In this flooding process a differential pressure $P_d$ is created, resulting from the atmospheric pressure $P_a$ in the infeed chamber 30 and the vacuum pressure $P_v$ in the vacuum chamber 4 (see FIG. 3) ($P_d=P_a-P_v$)

Because of this differential pressure, the grippers 3 are pivoted again and the substrate 2 is released. In this operation, the gripper of the substrate receiving part or of the plate 33 is activated at the same time, so that the substrate can be taken over by the plate 33. This process is repeated continually.

The vacuum chamber 4 is evacuated via the lines 38, 39 and the prepump 29.

Figure 3:
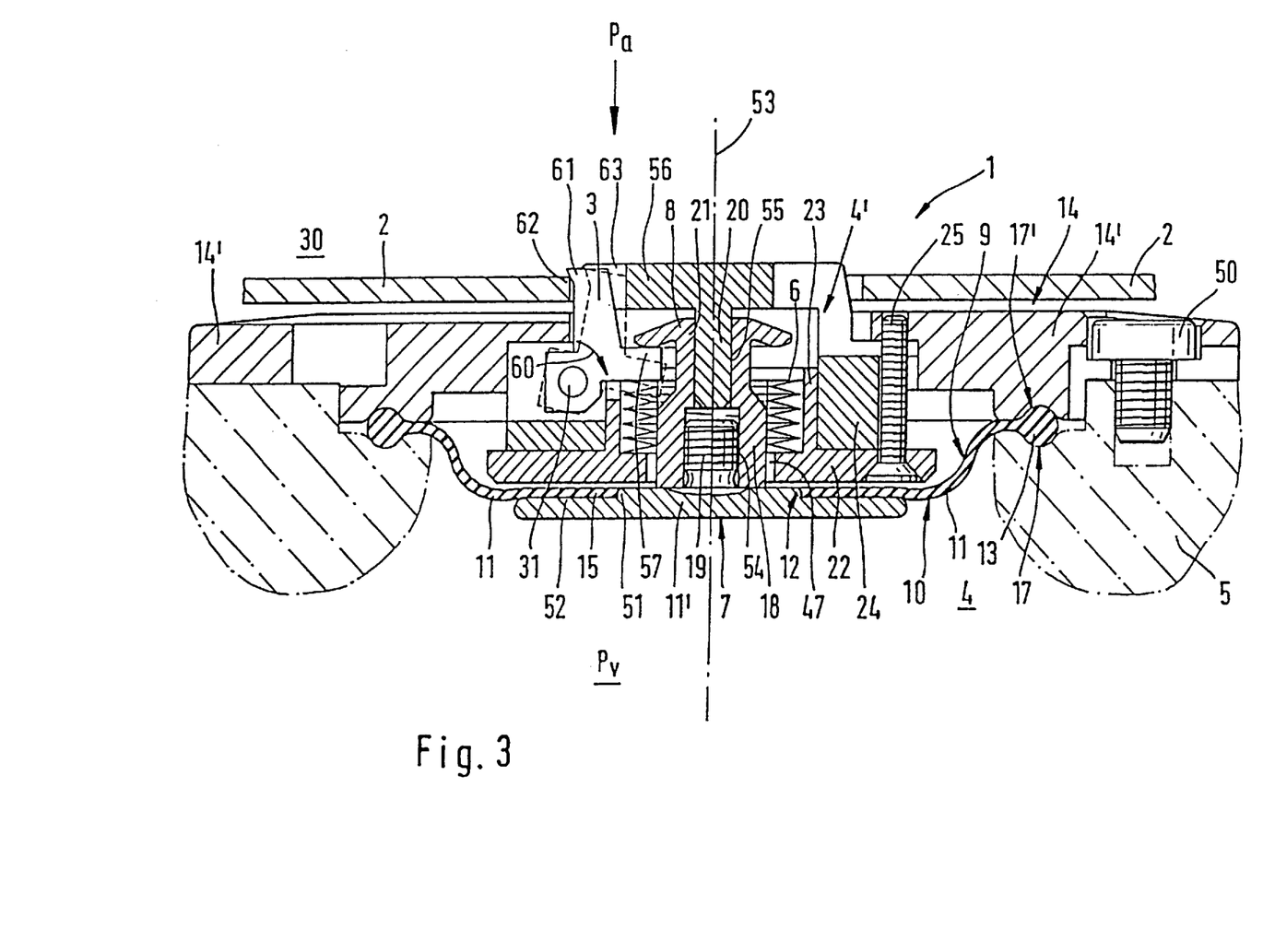
FIG. 3 is a cross-sectional elevational view a device according to the invention for gripping and holding a flat, preferably disklike, substrate.

In FIG. 3, the device 1 for gripping and holding the substrates 2 is shown in detail.

The device 1 comprises a flange 14', which is releasably joined to a substrate holder 5 via screw bolts 50. Between the flange 14' and the substrate holder 5, an annular circular groove 17, 17' is provided, in which a beadlike edge 13 of a diaphragm 7 is clamped. The diaphragm 7 is located in the vacuum chamber 4 and comprises one flexible part 11 and one nonflexible part 11', connected thereto. Nonflexible part 11' is a circular-round plate having a central cylindrical attachment portion 51 that is held in an opening 12 of the diaphragm 7. The plate 11' has a peripheral part 52 to which the flexible part 11 of the diaphragm 7 is secured or vulcanized. The diaphragm 7 seals off the upper portion of a vacuum chamber 4' (FIG. 3) or 4" (FIG. 1) from the vacuum chamber 4 that is exposed to a permanent vacuum pressure $P_v$. A vacuum is always present in chamber 4, located below diaphragm 7. A vacuum can be established in chambers 4' and 4" when cathode 41 is in its closed position and this vacuum will be released when cathode 41 is opened. The flexible part 11 of the diaphragm 7 is connected by its outer edge 13 to flange 14' and by its inner edge 13 to the cylindrical attachment 51. The outer edge 13 is clamped in groove 17, 17' of the flange 14' and substrate holder 5.

The vacuum chamber 4', 4" is exposed to an atmospheric pressure $P_a$ whenever the valve 32, as already mentioned, is opened and the infeed chamber 30 is flooded The plate 11' of the diaphragm 7 has a protrusion 19 which is oriented coaxially to a center axis 53 of the device 1. The protrusion 19 is firmly or integrally joined to the plate 11'. The protrusion 19 has male threads 54 and can therefore be joined or releasably screwed to a cylindrical part 18.

To that end, the cylindrical part 18 is likewise oriented coaxially to the flange 14', and in its upper region it has a cylindrical bore 55 into which a protrusion 20 extends. The protrusion 20 is joined to a cylindrical attachment 56, which is fixed to the flange 14' via connecting elements 25. The compact disk or substrate 2 can be slipped onto the cylindrical attachment 56 and held by means of the three or more grippers 3. The cylindrical part 18 is vertically movable with respect to the center axis 53 on the protrusion 20 if a pressure difference $P_d$ occurs.

An adjusting part, or bell-shaped flange, 8 is provided on the upper end of the cylindrical part 18. The adjusting part 8 is firmly connected to, or integral with, an upper end 21 of the cylindrical part 18.

As can be seen from FIG. 3, the flange 8 rests with its outer end against one lever arm 57 of each gripper 3. Each gripper 3 is pivotably mounted on a bolt 31 extending horizontally in terms of FIG. 3, between the position shown in solid lines (substrate holding position) and a position shown in broken lines (substrate release position).

The lower end of the cylindrical part 18 moves with its one end on plate 11' in the direction of the underside of a fixed flange 22, while with its other end, or adjusting part 8, it rests against the grippers 3 or the lever arms 57 thereof. In this operating state, the grippers 3 are oriented in the holding position shown in FIG. 3, in which the substrate 2 is held by the grippers 3. The flange 22 is firmly joined to a support part 24 and to the flange 14' via the connecting elements 25. Located on the flange 22 is a cylindrical extension 23, in which a spring, such as a cup spring, 6 is received. The spring is braced by its lower end against the flange 22 and by its upper end against the lever arms 57 of the grippers 3 and presses these lever arms, in the event of a pressure equilibrium $P_a=P_v$, into their holding position shown in FIG. 3. To that end, the cylindrical spring 6 surrounds the cylindrical part 18. The support part 24 joined to the flange 22 serves the purpose of pivotably receiving the grippers 3. In other words, pivot bolts 31 are held in support part 24. The flange 22 has a bore 47, through which the cylindrical part 18 extends.

The fixed flange 22 and the support part 24 are releasably connected to the flange 14' of the device 1 via the same connecting elements 25. The vacuum chamber 4', 4" provided above the diaphragm 7, or the infeed chamber 30 can be flooded via the valve 32 and evacuated via the pump 48, as already explained in conjunction with FIG. 1. The vacuum chamber 4 provided below the diaphragm 7 is not flooded when operation begins, and is evacuated or held at a certain pressure level via a vacuum pump 27 or the prepump 29.

If for the work process and for transporting the substrate 2 the infeed chamber 30 or vacuum chamber 4' is flooded via the valve 32 of FIG. 1, then an immediate pressure rise $P_a$ occurs above the diaphragm 7, so that because of the pressure differential $(P_d=P_1-P_v)$ the diaphragm 7 moves farther into the vacuum chamber 4, or downward in terms of FIG. 3, and by means of the adjusting part 8, the grippers 3 are pivoted inwardly as indicated by the arrow 60 out of the position shown in solid lines into the position shown in broken lines (substrate release position). In this process, the upper portion 61 of the gripper 3 moves out of range of one edge 62 of a bore 63 of the substrate 2 and in this way releases the substrate or compact disk for transporting.

Accordingly, with the system of the invention, automatic adjustment of the gripper 3 to a release position according to FIG. 3 is always effected when the infeed chamber 30 is flooded.

If the infeed chamber 30 or vacuum chamber 4' is again evacuated via the pump 48 after the substrate transfer, then a pressure equilibrium is brought about between the infeed chamber 30 and the vacuum chamber 4; as a result, the spring 6 moves the lever arms 57 and hence also the adjusting part 8 upward, since the same pressure states now prevail both on one side 9 and another side 10 of the diaphragm 7. As a result, the gripper system operates entirely without malfunction and can respond in the shortest possible time, that is, within milliseconds.

Because of the very fast response time of the grippers 3 and the automatic adjustment on flooding of the infeed chamber 30, the stability or the work process becomes freer of malfunction, and the cycle time is further shortened. Moreover, by means of this arrangement, the device 1 for gripping the substrates can be embodied substantially more simply and can thus be produced more economically, since one can make do with fewer components overall. The previous external triggering of the diaphragm for adjusting the grippers 3 was more vulnerable to malfunction and not so functionally reliable, because of the missing individual parts, for instance if the external supply pump for generating an overpressure at the diaphragm 7 failed.

The top side of the diaphragm communicates with the vacuum chamber 4' via the bore 47.

Figure 4:
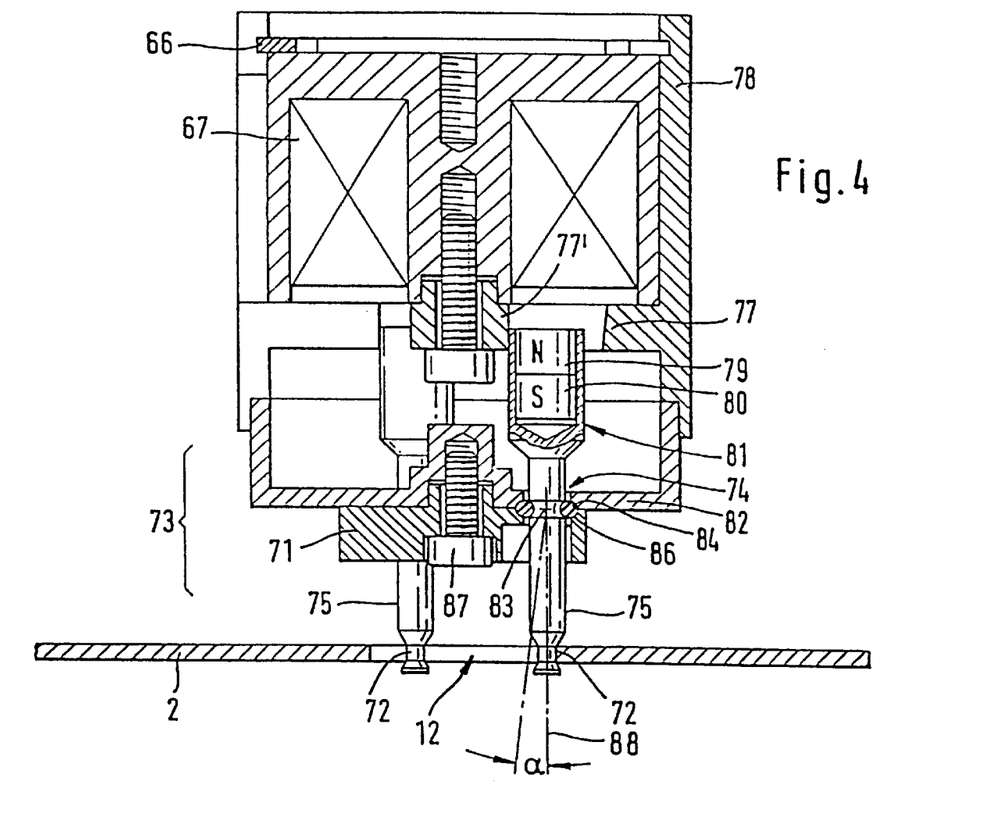
FIG. 4, a sectional view through a first substrate gripper with an electromagnetically acting adjusting device according to the invention.
Figure 6:
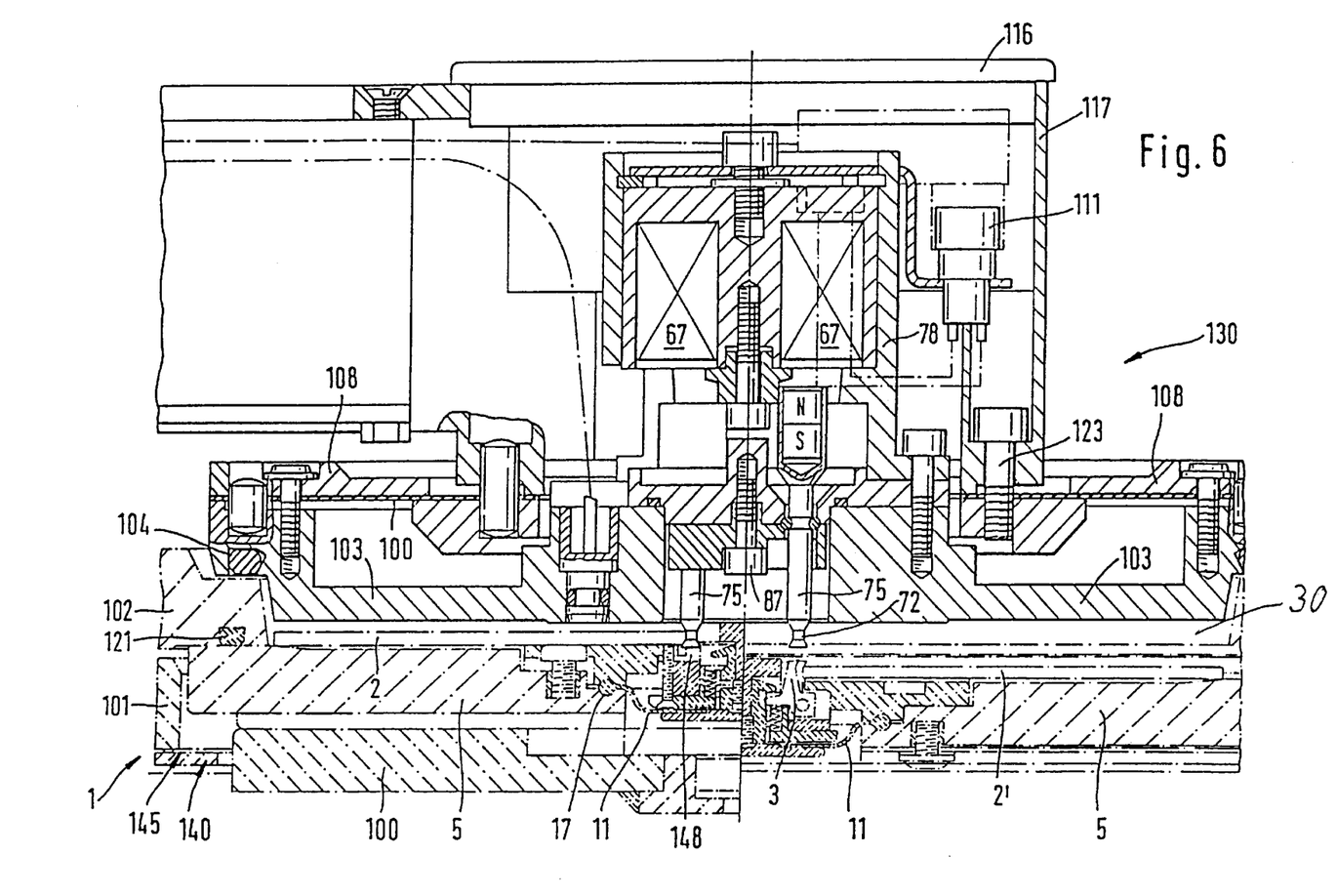
FIG. 6 is a cross-sectional elevational view apparatus according to the invention for transferring a substrate from one device having the electromagnetic adjuster to the second device having grippers controllable via a vacuum.

In FIGS. 4 and 6, a first device 130 for gripping and holding the substrates 2 is shown. Device 130 includes grippers 75 that can each be pivoted about a respective axis 83 that extends horizontally and perpendicular to the plane of FIG. 4. To that end, the grippers 75 are disposed in a cylindrical housing 78, which serves to receive an electromagnet 67 that can be connected via a plug 111 (see FIG. 6) to a power supply device, not shown in the drawing. The electromagnet 67 is secured by means of a securing ring 66 that is provided on the upper end of the housing 78. At its lower end, the housing has a bottom 82 with at least three openings 74, through which the grippers 75 extend. Via elastically embodied bearings 84, the grippers 75 are pivotable, about the axes 83 extending horizontally with reference to FIG. 4, between two stops 77, 77' that are firmly joined to the housing 78.

As can be seen from FIG. 4, the upper end of each gripper 75 has a cylindrical housing 81 for receiving one upper magnet 79 and one lower magnet 80. The cylinder housing 81 is embodied with thin walls and has a wall thickness between 0.2 mm and 1.0 mm, preferably between 0.3 mm and 0.7 mm, more preferably between 0.4 mm and 0.6 mm, and most preferably 0.5 mm, in order to assure a good holding force at the magnet 67 upon contact.

In the exemplary embodiment, the upper magnet is marked N and the lower magnet is marked S. By supplying current to the ring magnet 67, the gripper 75 can be positioned between the two stops 77 and 77', and in the course of its movement traverses the distance represented by the angle α. In the holding position, the longitudinal center axis of each gripper 75 extends parallel to the longitudinal center axis of the housing 78. In this position, the substrate is secured via groovelike indentations 72 provided on the lower end of gripper 75.

Figure 5:
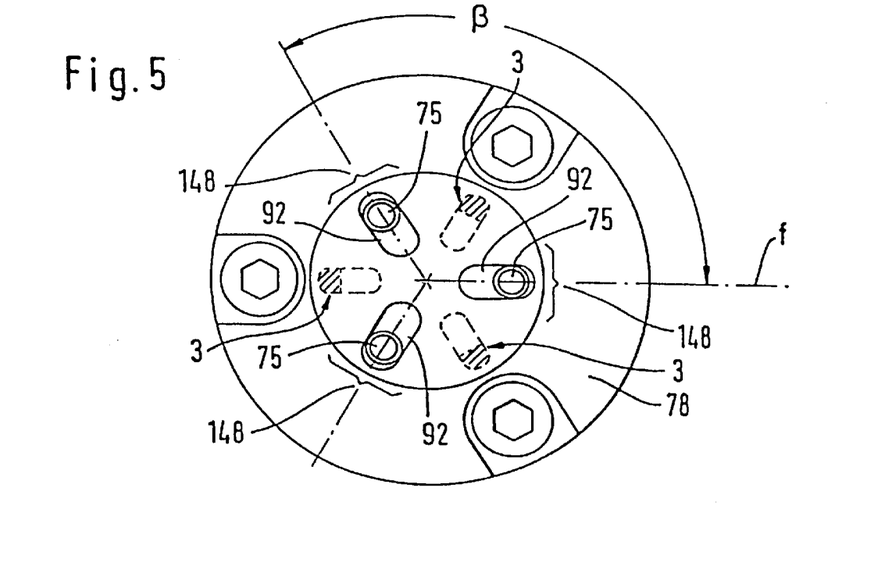
FIG. 5 is a schematic bottom plan view of the grippers of both devices according to the invention.

As seen in FIG. 5, the lower ends of the grippers extend through oblong slot openings 92, which assure an exact guidance of the grippers. If grippers 75 are pivoted by corresponding polarizations of the ring magnet 67 in terms of FIG. 4, then they moves from the left, or inner, stop 77' to the right, or outer, stop 77 and assume an inclined attitude, so that with their indentations 72 they move away from the peripheral region of the bore or opening 12 of the substrate 2 and release the substrate for transfer to the second device 1.

In the exemplary embodiment of FIG. 4, the elastically embodied bearing 84 can be received in a corresponding annular groove 86 provided in the bottom 82 and in an adjoining receiving part 71. To that end, the receiving part 72 is releasably connected to the bottom 82 of the housing 78 via screws 87.

As seen from FIG. 5, the individual grippers 75 of the first device 130 are oriented so as to be offset from one another by 120°, and in this way they are located in interstices 148 between grippers 3 of the second device 1 to grip a substrate. Because of the advantageously disposed interstices 148, the two devices 1 and 130 can be brought quite close together, and thus an exact transfer of a substrate between the two devices is assured; in such a transfer, each upper gripper 75 briefly engages at an interstice 148 between a respective pair of lower grippers 3 located side by side, once the two devices have been moved together.

As also seen in FIG. 5, the angle β between two side-by-side grippers 75 is 120°. The grippers 75, like the grippers 3, are arranged in a star pattern, and the angle between a gripper 75 and an adjacent gripper 3 is 60°.

Apparatus for gripping and holding the substrates 2 is shown more completely in FIG. 6, with the first device 130 of FIG. 4 being shown as the upper device and the second device 1 of FIGS. 1 and 3 being shown as the lower device. A substrate receiving part 73 (FIG. 4) formed by the grippers 75 and having the electromagnet 67 is, as shown in FIG. 6, received in a gripper carrier 117, which is releasably joined to a stop cap 108 via screw bolts 123. A feed cap 103 is releasably connected to the stop cap 108 by means of the screw bolts 123. The substrate receiving part 73 with the feed cap 103 forms the upper device 130 for receiving and gripping the substrates 2. If the substrate 2 is brought via the overall apparatus 130 to the second device 1 already described in detail with reference to FIG. 3, then the feed cap 103 presses sealingly via a seal 104 against the end face of a recipient cap 102 forming part of a second possible embodiment of a cathode which performs the same function as cathode 41. Between the surface of the substrate holder 5 and the underside of the feed cap 103, this forms the infeed chamber 30, which as shown in the schematic illustration of FIG. 1 can be either flooded or evacuated via the line 46 (not shown in FIG. 6).

Figure 7:
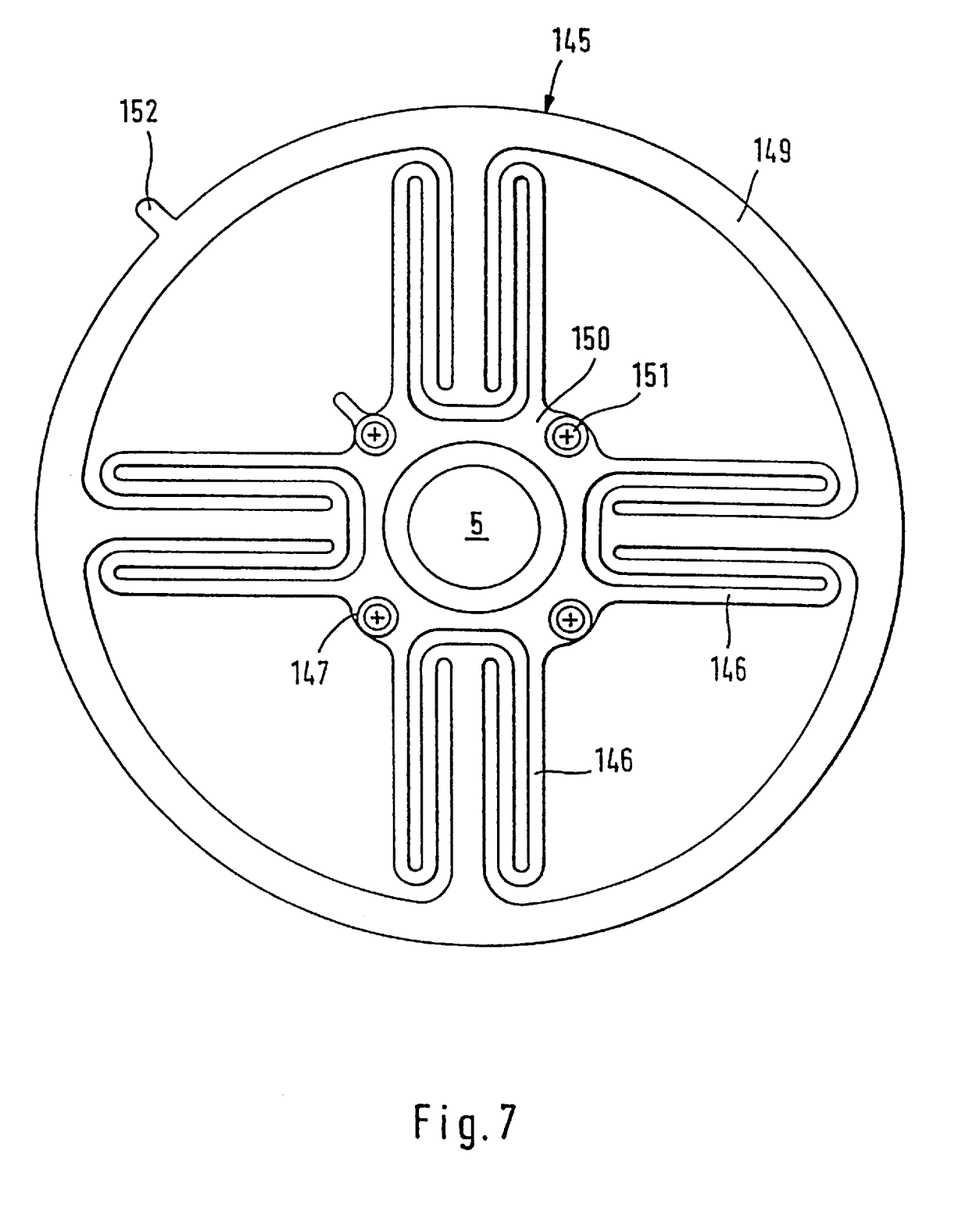
FIG. 7 is a plan view of a diaphragm-like spring between a turntable and a substrate holder in the apparatus of FIG. 6.

In FIG. 7, a spring-elastic connecting element or diaphragm part 145, also represented in FIG. 6, that allows reciprocation, is provided between a turntable 101 of FIG. 6, the second device 1 and the substrate holder 5; this connecting element or diaphragm part, formed as a circular disk, is equipped with an outer edge 149 which is joined via meandering or serpentine webs 146 to a centrally arranged flange 150. Turntable 101 corresponds to turntable 49 of FIG. 1. The flange 150 is joined to the substrate holder 5 via screw bolts 151, while the outer ring 149 is connected to the turntable 101. A protrusion 152 and a mating recess (not shown) in turntable 101 assure the correct mode of installation of the substrate holder 5 into the turntable 101 and lock the substrate holder 5 relative to the turntable 101.

By means of the diaphragm 145, these two parts are secured against relative rotation, and this assures that when the substrate holder 5 is raised the grippers 75 can engage the interstices of the grippers 3.

The transfer of the substrate 2 from the first device 130 to the second device 1 of FIG. 1 (as already described) and FIG. 6 is accomplished in the following steps:

First, the valve 26 is opened and the infeed chamber 30 is evacuated via the pump 48. This creates a pressure equilibrium on the top and bottom sides of the substrate holder 5. In this stage, the diaphragm 7 assumes the position shown in FIG. 3; the spring 6 pivots the lever or gripper 3 outward and thus holds the substrate 2 which has been delivered to it. At the same moment, the magnet 67 is triggered for this purpose and pivots the gripper 75 into an inclined position as shown in FIG. 4 (see angle α), in which the upper ends of the grippers come to rest against the corresponding stops 77 and in the process release the substrate 2.

A support plate 100 with the substrate holder 5 can now be thrust into the lower position, shown on the right in FIG. 6, and at the same time the plate or substrate holder 5 is entrained downward via the diaphragm or the connecting element 145, until the substrate holder 5 strikes a stop 140 of the turntable 101. The substrate holder 5 can now execute a pivoting motion about central pivot axis 160 of the turntable, shown in FIG. 1, without causing any relative motion between the substrate holder 5 and the turntable 101. Components 100 and 101 form elements of station 43, shown in FIG. 2.

After this work sequence, the substrate holder, identical to holder 5, of another second device 1 (not shown in the drawing) assumes the above-described position, to which end the support plate 100 with the substrate holder 1 is moved upward again, until it contacts a seal 121 and the infeed chamber 30 is closed. Plate 100 is integrated into the assembly which also includes elements 116, 117 and 130 and this assembly may be displaced by a conventional hydraulic system (not illustrated). In this adjusting operation, the substrate still remains engaged by the grippers 3 until such time as the valve 32 has opened and the infeed chamber is flooded, so that atmospheric pressure then enters the infeed chamber. This creates the aforementioned differential pressure between the top and bottom sides of the substrate holder 5, so that the diaphragm 7 moves farther into the vacuum chamber 4, and in the process pivots the grippers 3 out of the position shown in solid lines into the position shown in dashed lines in FIG. 3. As a result, the substrate or compact disk 2 is released. Now at the same moment the grippers 75 of the upper device 130 can also be triggered via the pole pieces, so that they are pivoted out of their inclined position into their vertically extending position shown in FIG. 4, in which they grasp the substrate 2. The substrate can now be lifted off, and by pivoting of the gripper carrier 117 the next substrate 2 can be put in the position described.

This application relates to subject matter disclosed in German application number 196 05 599.7, filed on Feb. 15, 1996, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

I claim:

1. An apparatus (1) for transporting substrates (2), said apparatus comprising:
    a first device (130) for gripping and holding one of the substrates; and
    at least one second device (1) for gripping and holding the substrates, the substrates being transportable between said first device and said second device, wherein
    said first device comprises three movably mounted first grippers (75) and first gripper displacement means operatively associated with said first grippers for moving said first grippers between a substrate gripping position and a substrate release position, and electromechanical means coupled to said first gripper displacement means for controlling said first gripper displacement means,
    said at least one second device comprises at least one substrate holder (5) disposed in a vacuum chamber (4, 4', 4") and three movably mounted second grippers (3), controlled by the pressure in the vacuum chamber,
    each of said devices and each of the substrates has a central axis, and
    said first device is movable into a substrate transfer position in which the central axis of said first device and the central axis of the one of the substrates being gripped and held by said first device are coaxial with the with the central axis of said second device.

2. The apparatus of claim 1 wherein said second device further comprises a turntable (101), and a spring-elastic connecting element (145) held between said turntable and said substrate holder to allow a reciprocating movement of said substrate holder relative to said turntable.

3. The apparatus of claim 1 wherein said connecting element (145) has a middle flange, connecting elements (147) joining said middle flange to said substrate holder (5), and elastic webs (146) extending between said middle flange and said turntable.

4. The apparatus of claim 1 wherein said movably mounted first grippers are pivotally movable about an axis between the substrate gripping position and the substrate release position.

5. The apparatus of claim 4 wherein said movably mounted first grippers have longitudinal axes which are at least approximately perpendicular to the axes about which said first grippers are pivotally movable.

6. The apparatus of claim 1 wherein said first gripper displacement means comprise an electromagnet which is energizable to move said first grippers to the substrate release position.

7. The apparatus of claim 1 wherein when said first device is in the substrate transfer position, said first grippers are located in spaces between said second grippers.

8. The apparatus of claim 1 wherein said first gripper displacement means comprise an electromagnet in the form of a ring magnet which is energizable to move said first grippers to the substrate release position, said first device further comprises a guide member having oblong slots for guiding said first grippers during movement between the substrate gripping position and the substrate release position, and said first grippers comprise a housing and a plurality of permanent magnets (80) which are disposed in said housing and cooperate with said ring magnet.

9. The apparatus of claim 8 wherein said housing has a thin wall with a wall thickness between 0.2 mm and 1.0 mm.

10. The apparatus of claim 9 wherein the wall thickness is between 0.3 mm and 0.7 mm.

11. The apparatus of claim 10 wherein the wall thickness is between 0.4 mm and 0.6 mm.

12. The apparatus of claim 1 wherein said first device further comprises a plurality of elastic ring bearings (84) each supporting a respective one of said first grippers, and magnetizable stops (77, 77') for limiting movement of said first grippers.

13. The apparatus of claim 1 wherein: said second grippers are movable between a substrate gripping position and a substrate release position; said second device further comprises a flange (22) which is fixed relative to said substrate holder and which has a cylindrical extension (23), and a biasing spring (6) for urging said second grippers toward the substrate gripping position; and said spring is received in said cylindrical extension.

14. The apparatus of claim 1 wherein said second device further comprises two flanges which are fixed relative to said substrate holder, and a support part (24) for supporting said second grippers for pivotal movement, said support part being held between said two flanges.

15. The apparatus of claim 14 further comprising connecting elements (25) removably connecting one of said flanges and said support part to the other one of said flanges.

16. The apparatus of claim 1 wherein:
the vacuum chamber has first and second chamber regions;

said second device further comprises second gripper displacement means operatively associated with said second gripper for moving said second gripper between a substrate gripping position and a substrate release position;

said second gripper displacement means comprise a diaphragm (7) supported by said substrate holder and having a movable portion which is movable relative to said substrate holder, a gripper displacement element (8) carried by said movable portion of said diaphragm and operatively engageable with said second gripper, said diaphragm being interposed between the two chamber regions so that a given pneumatic fluid pressure differential between opposite sides of said diaphragm produces movement of said gripper displacement element in a direction to move said second gripper to the substrate release position; and said apparatus further comprises: a first vacuum pump connected for evacuating the first chamber region, fluid supply means connected for supplying pneumatic fluid to the first chamber region, and a second vacuum pump connected for evacuating the second chamber region, said first and second vacuum pumps and said fluid supply means being controllable to selectively substantially equalize the pressures in the first and second vacuum regions.

17. The apparatus of claim 16 wherein the supplying of pneumatic fluid to the first chamber region initiates immediate movement of said second gripper to the substrate release position.

18. The apparatus of claim 16 wherein said second gripper is moved to the substrate release position by said second gripper displacement means whenever the pressure in the first chamber region corresponds to atmospheric pressure.

19. The apparatus of claim 16 wherein said second gripper is located at the side of said diaphragm which is in communication with the first chamber.

20. An apparatus (1) for transporting substrates (2), said apparatus comprising:

a first device (130) for gripping and holding the substrates; and at least one second device (1) for gripping and holding the substrates, the substrates being transportable between said first device and said second device, wherein said first device comprises at least one movably mounted first gripper (75) and first gripper displacement means operatively associated with said at least one first gripper for moving said at least one first gripper between a substrate gripping position and a substrate release position, said at least one second device comprises at least one substrate holder (5) disposed in a vacuum chamber (4, 4', 4") and at least one movably mounted second gripper (3), each of said devices has a central axis, and said first device is movable into a substrate transfer position in which the central axis of said first device is coaxial with the central axis of said second device, wherein when said first device is in the substrate transfer position, said first and second devices delimit an infeed chamber containing a substrate which is being held by one of said devices;

said second device further comprises second gripper displacement means operatively associated with said second gripper for moving said second gripper between a substrate gripping position and a substrate release position;

said second gripper displacement means comprise biasing means (6) for urging said second gripper toward the substrate gripping position, a diaphragm (7) supported by said substrate holder and having a movable portion which is movable relative to said substrate holder, a gripper displacement element (8) carried by said movable portion of said diaphragm and operatively engageable with said second gripper, and means for creating a pneumatic fluid pressure differential between opposite sides of said diaphragm for moving said gripper displacement element in a direction to move said second gripper to the substrate release position;

said first and second devices further comprise means for sealing the infeed chamber in a vacuum-tight manner when said first device is in the substrate transfer position; and said apparatus further comprises means for creating a vacuum pressure in the infeed chamber, which vacuum pressure acts on said diaphragm to effect movement of said second gripper to the substrate gripping position against the action of said biasing means.

21. The apparatus of claim 20 wherein one side of said diaphragm is exposed to an approximately constant vacuum pressure $P_v$, the other side of said diaphragm is exposed to a pressure $P_a$ that exists in said infeed chamber, and said diaphragm is exposed to a positive differential pressure $P_d = P_a - P_v$ that occurs whenever pressure is raised in said infeed chamber.

22. The apparatus of claim 20, wherein said diaphragm has one flexible part (11) and one nonflexible part (11').

23. The apparatus of claim 22 wherein the nonflexible part (11') is firmly joined to the flexible part (11) of said diaphragm.

24. The apparatus of claim 22 wherein the nonflexible part (11') is a circular plate, which covers an opening (12) of said diaphragm.

25. The apparatus of claim 24 wherein said second device further comprises a flange, said flexible part (11) of said diaphragm has an outer edge (13) which is firmly connected to said flange and an inner edge (15) which delimits said opening and is firmly connected to said plate (11').

26. The apparatus of claim 24 wherein said diaphragm and said plate (11') seal off the vacuum chamber (4), which is exposed to a constant vacuum pressure $(P_v)$, from said infeed chamber (30) that can be exposed to an atmospheric pressure.

27. The apparatus of claim 22 wherein said second device further comprises a flange, and said flexible part (11) of said diaphragm has an outer edge (13) which is firmly clamped and secured in at least one groove (17, 17') provided between said flange and an outer part of said substrate holder.

28. The apparatus of claim 22 wherein the nonflexible part is a plate (11) having a first protruding member (19), said second device further comprises a cylindrical part (18) which carries said gripper displacement element and is attached to said first protruding member, and a second protruding member (20) which is fixed relative to said substrate holder for guiding movement of said cylindrical part.

29. The apparatus of claim 28 wherein the cylindrical part (18) is firmly joined to said gripper displacement element.

30. The apparatus of claim 28 wherein said gripper displacement element has one end which rests against said at least one second gripper.

31. The apparatus of claim 28 wherein said second device has a flange (22) which is fixed relative to said substrate holder and said diaphragm is constructed to cause said plate to bear against said flange when there is no pressure differential between the opposite sides of said diaphragm.

32. The apparatus of claim 20 wherein a substrate to be transported has a bore delimited by an edge one side of said diaphragm communicates with a vacuum region of the vacuum chamber, the other side of said diaphragm communicates with the infeed chamber, and when a higher pressure exists in the infeed chamber than in the vacuum region, said diaphragm is displaced into the vacuum region by an amount to effect movement of said at least one second gripper to the substrate release position and away from the edge delimiting the bore of the substrate.

* * * * *